United States Patent [19]

Shin

[11] Patent Number: 6,130,829

[45] Date of Patent: Oct. 10, 2000

[54] HIGH VOLTAGE GENERATOR

[75] Inventor: Sang Ho Shin, Kyoungki-do, Rep. of Korea

[73] Assignee: Hyundai Electronics Industries Co., Ltd., Kyoungki-do, Rep. of Korea

[21] Appl. No.: 09/474,130

[22] Filed: Dec. 29, 1999

[30] Foreign Application Priority Data

Dec. 30, 1998 [KR] Rep. of Korea .................. 98-61953

[51] Int. Cl.[7] ............................................ H02M 3/18
[52] U.S. Cl. ............................................ 363/60
[58] Field of Search .................................... 363/59, 60

[56] References Cited

U.S. PATENT DOCUMENTS

| | | | |
|---|---|---|---|
| 4,638,464 | 1/1987 | Cranford, Jr. et al. | 365/226 |
| 5,260,646 | 11/1993 | Ong | 323/349 |
| 5,337,284 | 8/1994 | Cordoba et al. | 365/227 |
| 5,541,799 | 7/1996 | Schmidt et al. | 361/18 |
| 5,579,193 | 11/1996 | Schmidt et al. | 361/18 |
| 5,608,677 | 3/1997 | Yoon et al. | 365/189.09 |
| 5,761,151 | 6/1998 | Hatakeyama | 365/233 |
| 5,828,245 | 10/1998 | Brambilla et al. | 327/108 |
| 5,920,226 | 7/1999 | Mimura | 327/537 |
| 6,016,072 | 1/2000 | Ternullo, Jr. et al. | 327/535 |
| 6,057,725 | 5/2000 | Manning | 327/325 |

*Primary Examiner*—Adolf Deneke Berhane
*Attorney, Agent, or Firm*—Nath & Associates; Gary M. Nath; Harold L. Novick

[57] ABSTRACT

A high voltage generator generates a high voltage higher than a power-supply voltage by a predetermined potential in order to supplement a loss of a threshold potential of a transistor in a semiconductor memory device. The high voltage generator has each potential sensing unit for a standby mode and active mode. In case of the standby mode, the high voltage generator minimizes a current consumption, and stably generates a high voltage. In case of the active mode, the high voltage generator limits a potential variation width of high voltage, thereby stably generating a high voltage at a high-speed.

7 Claims, 4 Drawing Sheets

HIGH VOLTAGE GENERATOR

BACKGROUND OF THE INVENTION

1. Field of the Invention

The present invention relates to a high voltage generator for generating a high voltage higher than a power-supply voltage by a predetermined potential in order to supplement a loss of a threshold potential of a transistor in a semiconductor memory device. More particularly, it relates to a high voltage generator for ensuring a reduction of a current consumption in a standby mode as well as a high-speed operation in an active mode.

2. Description of the Prior Art

In general, a high voltage (hereinafter referred to as 'Vpp') generator provides a constant high voltage to a circuit of chip requiring a voltage higher than a power-supply voltage Vcc, and is widely employed to a memory circuit field such as a DRAM, especially to a word line driver and a bit line division circuit and a data output buffer, etc.

FIG. 1 is a circuit diagram of a conventional high voltage generator.

As shown in FIG. 1, the conventional high voltage generator includes: potential sensing units 10 and 12 which are selectively enabled in a standby mode and an active mode, sense a high voltage (Vpp) potential level in each mode, and generate potential sensing signals det1 and det2; delay units 20 and 22 for delaying the potential sensing signals det1 and det2 from the potential sensing units 10 and 12 by a predetermined time; oscillation units 30 and 32 which receive the potential sensing signals det1 and det2 of each mode (i.e., standby mode and active mode) from the delay units 20 and 22, are driven by the potential sensing signals det1 and det2, and generate a pulse signal with a predetermined period in order to operate pumping units 40 and 42; and pumping units 40 and 42 for performing a potential pumping operation according to the pulse signal from the oscillation units 30 and 32, and adjusting a potential of a high voltage.

The potential sensing unit 10 for sensing a high voltage Vpp potential level in the standby mode includes: two PMOS transistors MP11 and MP12 having gate terminals commonly grounded, the PMOS transistor MP11 being connected between a power-supply voltage Vcc terminal and a node N11, and the other PMOS transistor MP12 being connected between a high voltage Vpp terminal and a node N12; two NMOS transistors MN11 and MN12 whose gate terminals are commonly connected to the node N11; and an inverter IV11 connected to the node N12.

At this time, since the potential sensing unit 10 is operated in a standby mode, the potential sensing unit 10 has a low current consumption and a slow operation speed.

The pumping unit 40 used for a potential pumping operation in the standby mode employs a low driving power, because consuming a high voltage Vpp in the standby mode is based on a leakage current of a very small quantity.

In the meantime, the potential sensing unit 12 for sensing a high voltage Vpp potential level in active mode includes: two PMOS transistors MP13 and MP14 having gate terminals commonly grounded, the PMOS transistor MP13 being connected between a power-supply voltage Vcc terminal and a node N13, and the other PMOS transistors MP14 being connected between a high voltage Vpp terminal and a node N14; two NMOS transistors MN13 and MN14 having gate terminals commonly connected, which are respectively connected to the two nodes N13 and N14; two NMOS transistors MN15 and MN16 which are respectively connected between the two NMOS transistors MN13 and MN14 and a ground terminal, and have gate terminals receiving an operation control signal act of informing an active mode's start; and an inverter IV12 connected to the node N14.

Since the potential sensing unit 12 is operated in active mode, the potential sensing unit 12 should be designed to have an operation speed of high speed occurring a current consumption of high value. The pumping unit 42 used in active mode has a plurality of circuits for performing a charging/precharging operation by using a high voltage Vpp, so that it should have a high driving power.

FIG. 2 is a timing diagram of a high voltage generator shown in FIG. 1.

Although there is a time lag between the pumping unit 42 enabled in active mode and the pumping unit 40 enabled in a standby mode, the pumping unit 42 enabled in active mode and the pumping unit 40 enabled in a standby mode are driven by the same method, so that a description about one mode will be discussed.

If a high voltage Vpp shown in FIG. 2(a) is lower than a reference potential $V_{target}$, the potential sensing unit 10 or 12 changes a state of a potential sensing signal det1 or det2 to a logic low state as shown in FIG. 2(b) in order to operate a pumping unit 40 or 42, thus generates a logic low signal.

Then, the potential sensing signal det1 or det2 passes through a delay unit 20 or 22, and is delayed by a predetermined time t1. Accordingly, the oscillation unit delays a pump enable signal ppe for driving a pumping unit by the predetermined time t1 as shown in FIG. 2(c), a then generates the pump enable signal ppe delayed.

The pump enable signal ppe drives the pumping units 40 and 42, thereby achieving a potential pumping operation of a high voltage Vpp. Accordingly, if the potential level of a high voltage Vpp reaches to the target value $V_{target}$, a potential sensing unit senses the high voltage potential level reached to the target value $V_{target}$, and changes a state of the pump enable signal ppe to a disable state so as to stop a pumping operation.

However, the potential sensing signal det1 or det2 generated to stop the pumping operation is delayed by a delay unit by a predetermined time t1, and is then transmitted to the oscillation units 30 and 32. After elapsing a time period t1 from a time point at which the potential sensing units 10 and 12 sense that a potential level of high voltage Vpp is beyond the target value $V_{target}$, the oscillation units 30 and 32 changes a state of a pump enable signal ppe for controlling a pumping unit, and thereby generating a pump enable signal ppe having a changed state.

As a result, although the potential level of high voltage Vpp reaches to a predetermined level $V_{target}$, unnecessary pumping operation is continuously performed for the time period t1 made by the delay unit, thereby raising a potential over the target value $V_{target}$.

After the time period t1, the pumping unit stops operating by the transition pump enable signal ppe, then the potential level of high voltage Vpp is slowly lowered by a leakage current. At this time, if the potential level of high voltage Vpp is lower than the target value $V_{target}$, the aforementioned operations are repeated again, thereby performing a charge pumping.

In this case, since the pumping operation is delayed by the time period t1, the potential level of high voltage becomes lowered than the reference potential value $V_{target}$ during the time period t1.

Accordingly, the conventional art which performs a charge pumping operation by using a predetermined delay time made by the delay unit in order to control a potential level can maintain a high voltage Vpp of a stable and constant potential level in case of a small quantity of current consumption. But, if an active mode requiring a high-speed operation starts as an abrupt current consumption by operations of a word line and peripheral circuits occurs, a response speed is greatly slowed down, thereby making it impossible to perform a stable operation.

In addition, if a pump driving power raises to correspond to much current consumption and a pumping operation is performed for a predetermined time, the conventional art may greatly change a potential level of high voltage in case of a little current consumption.

Namely, the conventional high voltage generator performs a stable operation without changing a high voltage potential level in case of a little leakage current. But, in case of active mode, it has a slowed response speed and raises a trembling degree of a potential level.

SUMMARY OF THE INVENTION

Accordingly, the present invention is directed to a high voltage generator that substantially obviates one or more of the problems due to limitations and disadvantages of the related art.

It is an objective of the present invention to provide a high voltage generator for ensuring a high-speed operation in an active mode simultaneously with lowering a current consumption in a standby mode.

To achieve the above objective, a high voltage generator for generating a high voltage by performing a charge pumping operation through each pulse signal in a standby mode and active mode includes: a first potential sensing unit which is operated in the standby mode, and senses a high voltage; a delay unit for generating a pulse signal after delaying an output signal of the first potential sensing unit by a predetermined time; a second potential sensing unit which is operated in the active mode, and senses a high voltage; and a pumping control unit for generating a corresponding pulse signal through an output signal of the second potential sensing unit.

The first potential sensing unit only senses one specific potential, and the second potential sensing unit only senses two specific potentials.

Additional features and advantages of the invention will be set forth in the description which follows, and in unit will be apparent from the description, or may be learned by practice of the invention. The objective and other advantages of the invention will be realized and. attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 3:
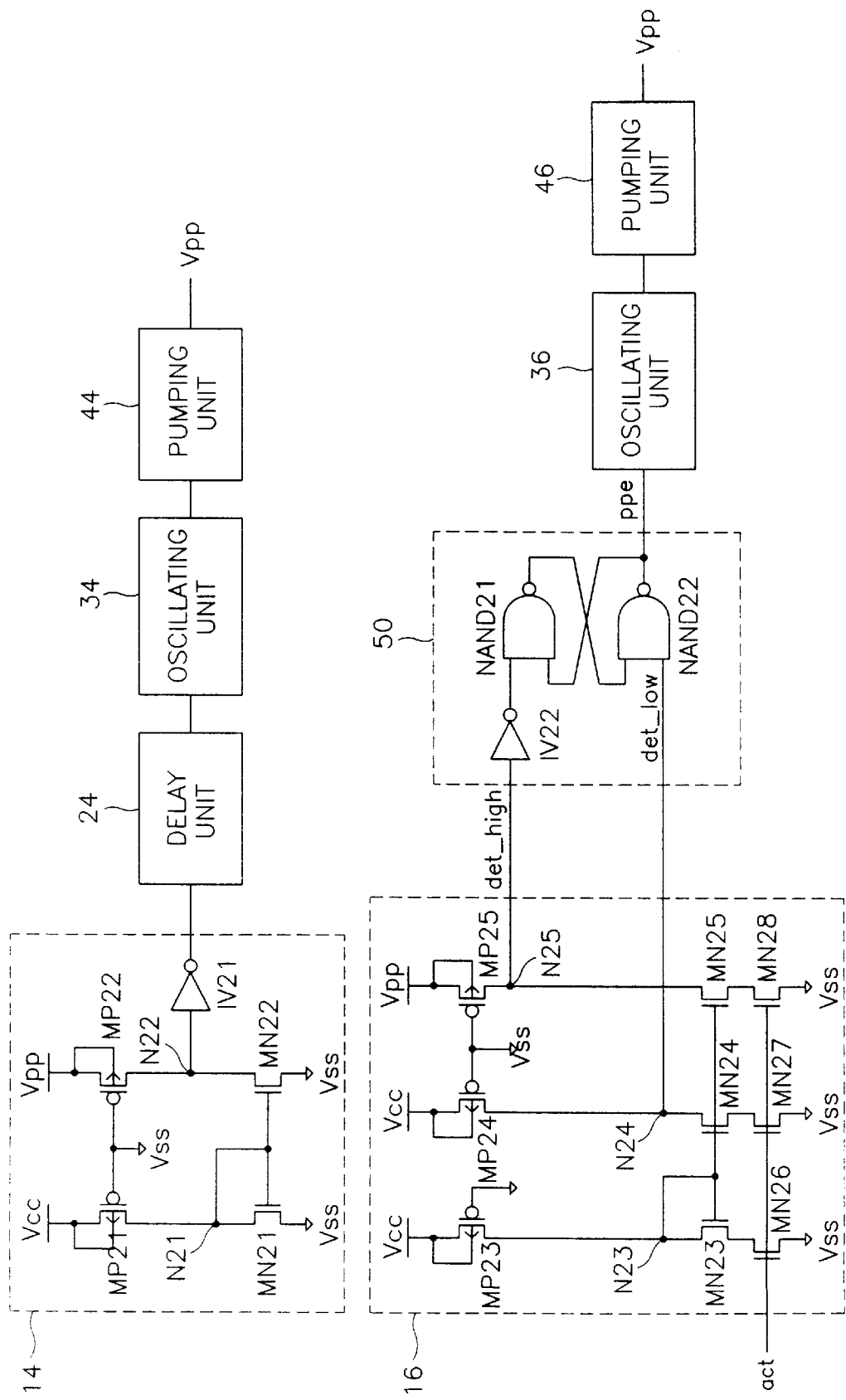
FIG. 3 is a circuit diagram of a high voltage generator according to the present invention.

FIG. 3 is a circuit diagram of a high voltage generator according to the present invention.

As shown in FIG. 3, the high voltage generator includes: a potential sensing unit 14 which is enabled in only standby mode, and senses a potential level of high voltage Vpp; a potential sensing unit 16 which is enabled in only active mode, and senses two specific potential levels V_high and V_low which are a maximum potential level and a minimum potential level in order to previously reduce a high voltage variation width; a delay unit 24 for receiving an output signal of the potential sensing unit 14 for the standby mode, and delaying the output signal of the potential sensing unit 14; a pumping controller 50 for combining two specific potential level sensing signals det_high and det_low sensed by the potential sensing unit 16 for the active mode, and controls a pumping operation by controlling enabling a pump enable signal ppe; oscillation units 34 and 36 for receiving output signals of the delay unit 24 and the pumping controller 50, and generating a pulse signal having a constant period; and pumping units 44 and 46 for receiving a pulse signal generated from the oscillation units 34 and 36, and performing a charge pumping operation.

Figure 1:
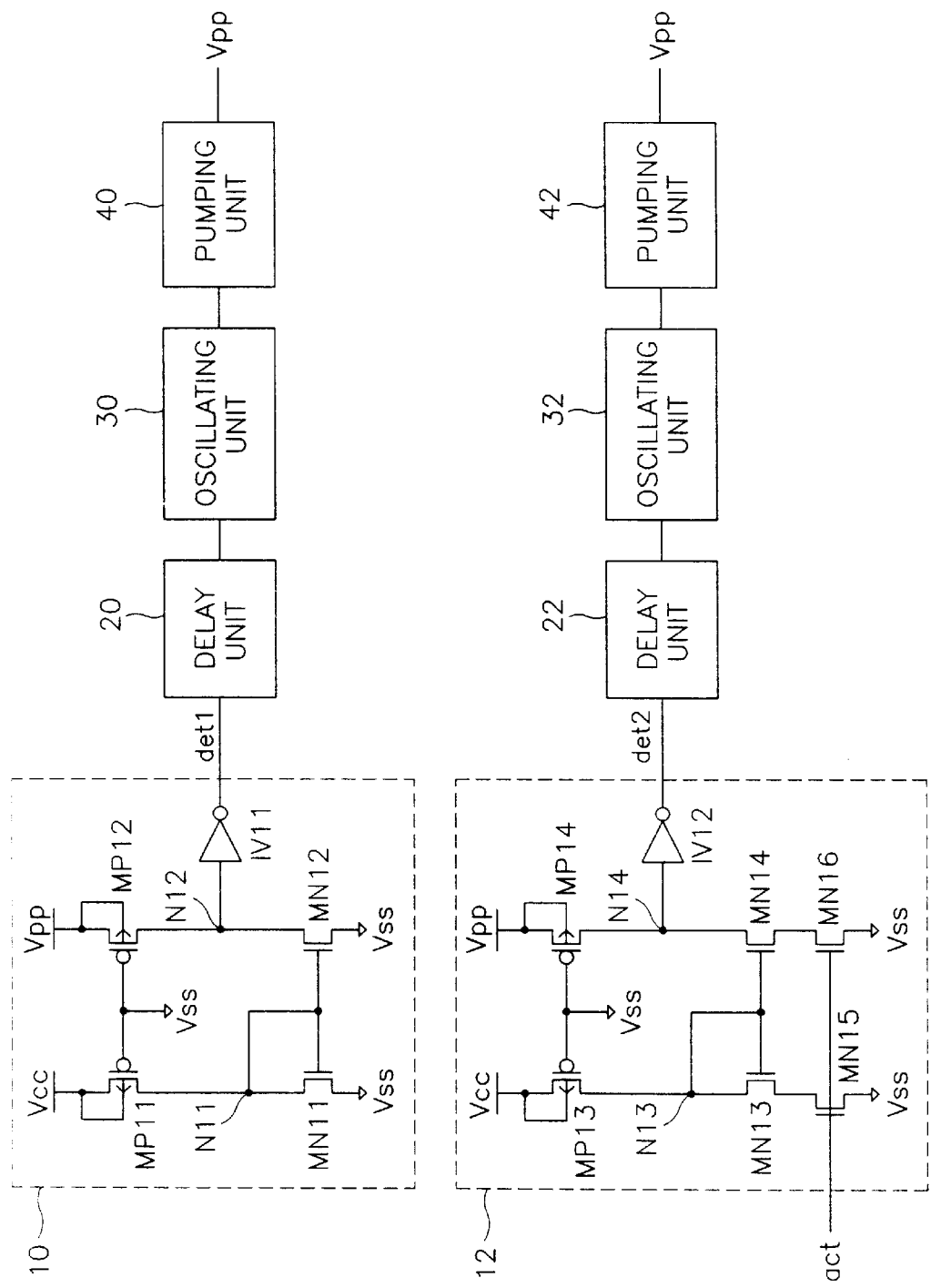
FIG. 1 is a circuit diagram of a conventional high voltage generator.
Figure 2:
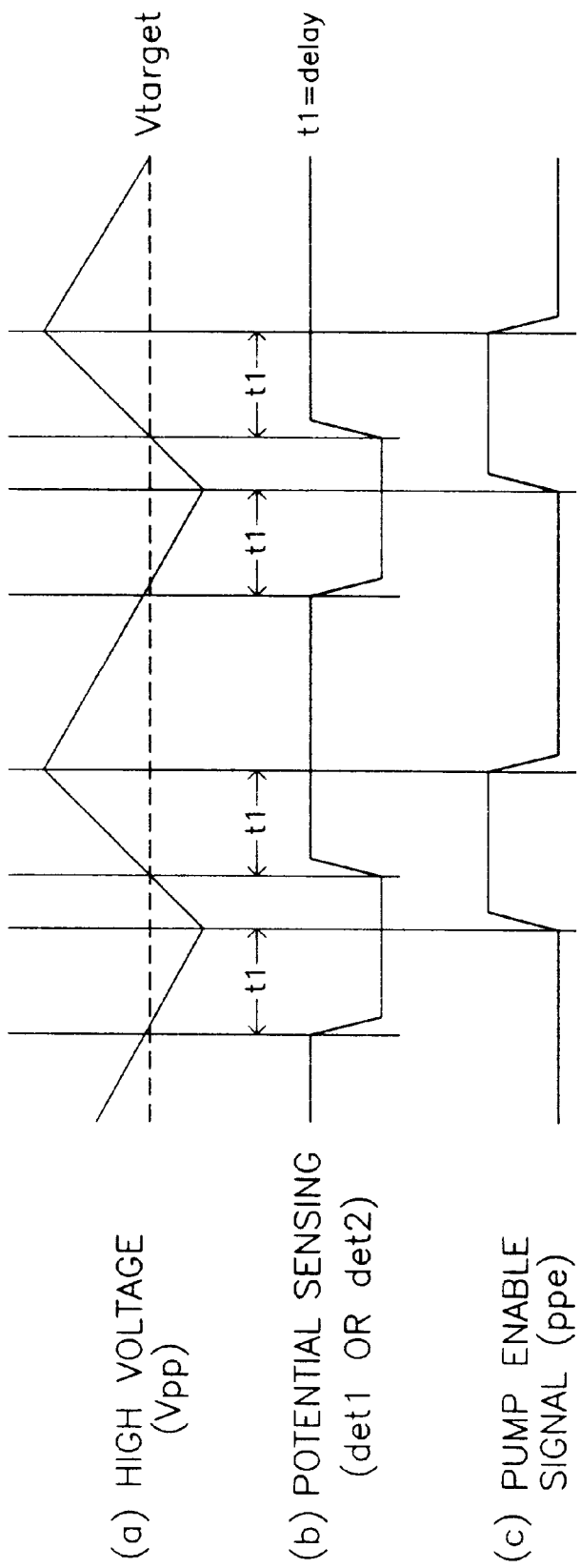
FIG. 2 is a timing diagram of a high voltage generator shown in FIG. 1.

The potential sensing unit 14 for standby mode is the same as the two potential sensing units 10 and 12 shown in FIG. 1, thereby a description about the potential sensing unit 14 will be omitted below.

In the meantime, the potential sensing unit 16 for active mode includes: PMOS transistor MP23 which is connected between a power-supply voltage Vcc and a node N23, and has a gate terminal grounded; two PMOS transistors MP24 and MP25 which are respectively connected between a high voltage (Vpp) terminal and nodes N24 and N25, and have gate terminals commonly grounded; NMOS transistors MN23, MN24 and MN25 which are connected to the nodes N23, N24, and N25, and have gate terminals commonly connected to the node N23; and NMOS transistor MN26, MN27 and MN28 which are connected between the NMOS transistors MN23, MN24, and MN25 and a ground terminal, and have gate terminals receiving a control signal act informing an active mode's start.

The pumping controller 50 receives two potential sensing signals det_low and det_high generated from the potential sensing unit 16 for active mode through the nodes N24 and N25. The pumping controller 50 includes: an inverter IV22 for inverting a first potential sensing signal det_high applied from the node N25; and two NAND gates NAND21 and NAND22 which employ an output signal of the inverter IV22 and a second potential sensing signal det_low applied from the node N24 as a first input signal, and employ output signals of the NAND gates NAND21 and NAND22 as a second input signal.

Figure 4:
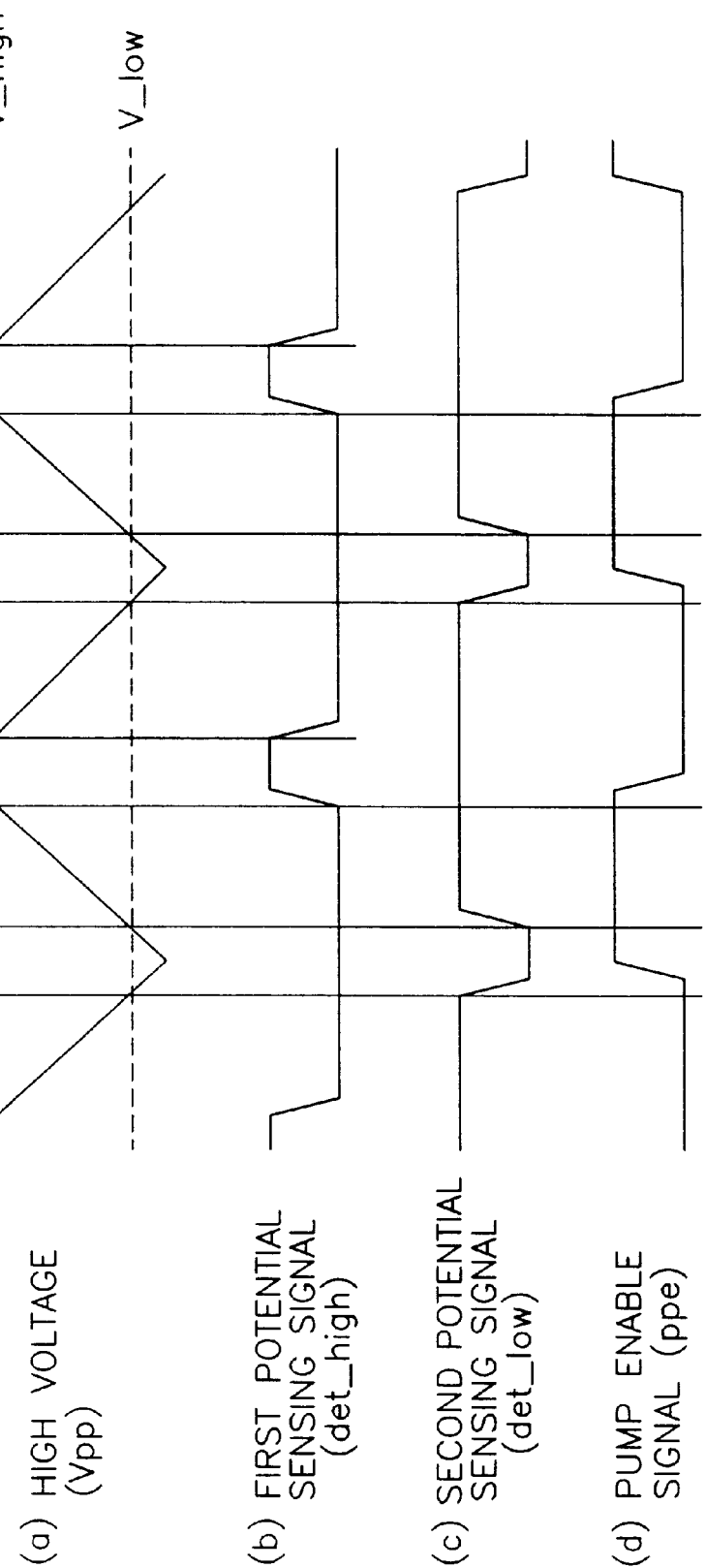
FIG. 4 is a timing diagram of a high voltage generator shown in FIG. 3 according to the present invention.

FIG. 4 is a timing diagram of a high voltage generator shown in FIG. 3 according to the present invention.

The potential sensing unit 16 senses a potential level of high voltage Vpp shown in FIG. 4 (*a*). If the sensed potential level reaches to a predetermined maximum value V_high, a first potential sensing signal det_high of a logic high state is generated as shown in FIG. 4(b).

At this time, a second potential sensing signal det_low of sensing a minimum value V_low of high voltage is disabled as a logic high state.

Accordingly, the pumping controller 50 receives a first potential sensing signal det_high of a logic high state and a second potential sensing signal det_low of a logic high state, and generates a pump enable signal ppe as a disable state of a logic low state by combination of the two signals det high and det_low.

As a result, the pumping unit 46 is disabled, and thus stops a charge pumping operation.

After that, as a pumping operation stops, a potential level of high voltage Vpp becomes gradually lowered. If the potential level of high voltage Vpp reaches to a predetermined minimum value V_low, the potential sensing unit 16 senses the predetermined minimum value V_low, and changes a state of a second potential level sensing signal det_low to a logic low state.

Then, the pumping controller 50 receives the second potential sensing signal det_low of a logic low state, and changes a state of a pumping enable signal to a logic high state. Therefore, the pumping unit 46 raises a potential level of high voltage Vpp by performing a charge pumping operation.

After that, if the predetermined maximum value V_high is sensed again as the potential level of high voltage Vpp raises, the high voltage generator according to the present invention stably generates a potential level of high voltage by repeating the aforementioned operations.

As described above, when sensing two reference potential values V_high and V_low, the high voltage generator according to the present invention directly controls a pump enable control signal ppe without a predetermined delay time t1 required to the conventional art, thereby limiting a potential variation width of high voltage as a range between the two potential values V_high and V_low.

The high voltage generator according to the present invention has each potential sensing unit for a standby mode and active mode. In case of the standby mode, the high voltage generator lowers a current consumption, and stably generates a high voltage. In case of the active mode, the high voltage generator limits a potential variation width of high voltage as a range between the two potential values V_high and V_low, thereby stably generating a high voltage at a high-speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A high voltage generator for generating a high voltage by performing a charge pumping operation through each pulse signal in a standby mode and active mode, comprising:

a first potential sensing means which is operated in the standby mode, and senses a high voltage;

a delay means for generating a pulse signal after delaying an output signal of the first potential sensing means by a predetermined time;

a second potential sensing means which is operated in the active mode, and senses a high voltage; and a pumping control means for generating a corresponding pulse signal through an output signal of the second potential sensing means.

2. A high voltage generator according to claim 1, wherein:

the first potential sensing means only senses one specific potential, and the second potential sensing means only senses two specific potentials.

3. A high voltage generator according to claim 1, wherein:

the pumping control means generates a control signal by combining two specific potential sensing signals.

4. A high voltage generator, comprising:

a first potential sensing means which is enabled in a standby mode, and senses a potential level of high voltage;

a second potential sensing means which is enabled in an active mode, and senses two specific potential levels of high voltage;

a delay means for delaying an output signal of the first potential sensing means by a predetermined time;

a pumping control means for combining two specific potential level sensing signals sensed by the second potential sensing means, and generate a pump enable control signal according to a state of the two specific potential level sensing signals;

first and second oscillation means for receiving output signals of the delay means and the pumping control means, and generating a pulse signal having a constant period; and first and second pumping units for receiving a pulse signal generated from the first and second oscillation means, and performing a charge pumping operation.

5. A high voltage generator according to claim 4, wherein:

two specific potential levels sensed by the second potential sensing means are a predetermined maximum value and a predetermined minimum value for reducing a high voltage variation width in a potential variation range of high voltage.

6. A high voltage generator according to claim 4, wherein the second potential sensing means comprises:

a first PMOS transistor which is connected between a power-supply voltage and a first node, and has a gate terminal grounded;

second and third PMOS transistors which are connected between a high voltage terminal and second and third nodes, have gate terminals commonly grounded;

first to third NMOS transistors which are connected to each nodes of the first to third nodes, and have gate terminals commonly connected to the first node; and fourth to sixth NMOS transistors which are connected between the first to third NMOS transistors and a ground terminal, and have gate terminals commonly receiving a control signal informing an active mode's start.

7. A high voltage generator according to claim 6, wherein the pumping control means comprises:

an inverter for receiving a potential signal of the third node as an input, and inverting the potential signal; and first and second NAND gates for employing an output signal of the inverter and a potential signal of the second node as a first input signal, and employing output signals of the first and second NAND gates as a second input signal.

* * * * *